US005529115A

United States Patent [19]

Paterson

[11] Patent Number: 5,529,115
[45] Date of Patent: *Jun. 25, 1996

[54] INTEGRATED CIRCUIT COOLING DEVICE HAVING INTERNAL COOLING CONDUIT

[75] Inventor: Robert W. Paterson, Seneca, S.C.

[73] Assignee: AT&T Global Information Solutions Company, Dayton, Ohio

[ * ] Notice: The term of this patent shall not extend beyond the expiration date of Pat. No. 5,390,077.

[21] Appl. No.: 274,947

[22] Filed: Jul. 14, 1994

[51] Int. Cl.⁶ .................................................. F28D 15/00
[52] U.S. Cl. ............................. 165/104.33; 165/104.21; 165/80.4; 257/719; 257/715; 361/693; 361/700
[58] Field of Search ......................... 165/104.33, 104.21, 165/184, 80.4; 361/700–701, 709, 710, 690, 693, 702; 257/715, 718, 719, 184

[56] References Cited

U.S. PATENT DOCUMENTS

| | | | |
|---|---|---|---|
| 3,024,298 | 7/1958 | Goltsos et al. | 165/104.33 X |
| 3,609,991 | 10/1971 | Chu et al. | 361/700 X |
| 4,154,296 | 5/1979 | Fijas | 165/184 X |
| 4,519,447 | 5/1985 | Wiech, Jr. | 165/104.33 |
| 4,572,286 | 2/1986 | Fujii et al. | 165/104.29 |
| 4,619,316 | 10/1986 | Nakayama et al. | 165/104.33 |
| 4,653,579 | 3/1987 | Fujii et al. | 165/104.29 |
| 4,698,728 | 10/1987 | Tustaniwskyj et al. | 361/385 |
| 4,704,658 | 11/1987 | Yokouchi et al. | 165/104.33 X |
| 4,750,086 | 6/1988 | Mittal | 361/382 |
| 4,796,155 | 1/1989 | Saito et al. | 165/104.33 X |
| 4,799,543 | 1/1989 | Iversen et al. | 165/135 |
| 4,823,863 | 4/1989 | Nakajima et al. | 165/80.4 |
| 4,862,321 | 8/1989 | Saitoo et al. | 361/700 |
| 4,866,570 | 9/1989 | Porter | 361/382 |
| 4,870,477 | 9/1989 | Nakanishi et al. | 357/82 |
| 4,893,590 | 1/1990 | Kashimura et al. | 165/80.4 |
| 4,920,574 | 4/1990 | Yamamoto et al. | 361/385 |
| 4,928,206 | 5/1990 | Porter et al. | 361/385 |
| 4,966,226 | 10/1990 | Hamburgen | 165/104.33 X |
| 5,000,256 | 3/1991 | Tousignant | 165/46 |
| 5,052,476 | 10/1991 | Sukumoda et al. | 165/184 X |
| 5,099,908 | 3/1992 | Taraci et al. | 165/104.33 X |
| 5,103,899 | 4/1992 | Kalina | 165/104.21 X |
| 5,138,524 | 8/1992 | Smithers | 257/718 X |
| 5,212,626 | 5/1993 | Bell et al. | 361/385 |
| 5,216,580 | 6/1993 | Davidson et al. | 361/385 |
| 5,262,921 | 11/1993 | Lamers | 165/104.33 X |
| 5,263,536 | 11/1993 | Hulburd et al. | 165/80.4 |
| 5,390,077 | 2/1995 | Paterson | 165/104.33 X |

FOREIGN PATENT DOCUMENTS

| | | | |
|---|---|---|---|
| 2704781 | 8/1978 | Germany | 165/104.33 |
| 0103338 | 6/1982 | Japan | 165/104.33 |
| 1764199 | 9/1992 | U.S.S.R. | 361/700 |
| 0804297 | 11/1958 | United Kingdom | 165/104.33 |

Primary Examiner—John Rivell
Assistant Examiner—Christopher Atkinson
Attorney, Agent, or Firm—Paul J. Maginot

[57] ABSTRACT

An apparatus for cooling an integrated circuit device includes a container defining a chamber that is partially filled with a coolant which forms a coolant pool in the chamber, wherein heat generated by the integrated circuit device causes boiling of the coolant in the coolant pool so that vaporized coolant rises upwardly from the coolant pool and condenses on a ceiling of the chamber forming coolant droplets thereon. The apparatus further includes a cooling conduit positioned within the chamber and at least partially out of the coolant pool, the cooling conduit further being positioned (1) in a first path traveled by the vaporized coolant as it rises upwardly from the coolant pool towards the ceiling, and (2) in a second path traveled by the coolant droplets falling from the ceiling due to gravity.

20 Claims, 5 Drawing Sheets

INTEGRATED CIRCUIT COOLING DEVICE HAVING INTERNAL COOLING CONDUIT

CROSS REFERENCE

Cross reference is made to co-pending U.S. patent application Ser. No. 08/274,937 now U.S. Pat. No. 5,390,077, entitled "Integrated Circuit Cooling Device having Internal Baffle" by Robert W. Paterson which is assigned to the same assignee as the present invention, and filed concurrently herewith, and issued as U.S. Pat. No. 5,390,077.

BACKGROUND OF THE INVENTION

The present invention relates generally to dissipation of heat generated by electronic components, and more particularly to an apparatus for cooling an integrated circuit device.

Cooling of certain integrated circuit devices is necessary to ensure their proper operation and useful life. Also, cooling provides for enhanced performance of such integrated circuit devices.

Various designs for apparatus which cool integrated circuit devices have been developed. Such devices include mechanisms which circulate coolants such as air, water and fluorocarbons through the housings in which they are contained.

One example of such a design is U.S. Pat. No. 4,572,286 which discloses a boiling cooling apparatus that includes a heat generating device which is completely immersed in a liquid coolant which partially fills a sealed container. At least one vertically extending passage is provided through the heat producing device whereby ascending bubbles formed in the passage by the heat transfer from the heat generating device to the liquid medium cause an upward current flow through the passage. A plurality of current flow control plates are provided for diverting the upward flow of liquid coolant laterally and downwardly along the sides of the container to provide convection cooling and directing the downward flow of the liquid coolant into the lower end of the passage in the heat generating device to provide a cyclic flow of the cooling liquid.

Another example is U.S. Pat. No. 4,698,728 which describes a liquid cooling system that includes a frame holding a plurality of printed circuit boards, each of which has electrical components attached thereto. The system further includes a top reservoir for holding a liquid at atmospheric pressure, a conduit for conveying the liquid in a downward direction from the top reservoir over the components, a bottom reservoir for receiving the liquid plus any air due to leaks from the conduit, a pump for sucking the liquid and air through the conduit at subatmospheric pressures and for returning the liquid to the top reservoir.

Yet another example is U.S. Pat. No. 5,216,580 which discloses an optimized integral heat pipe and electronic circuit module arrangement. A ceramic multi-chip module bearing electronic circuit components has applied to the side opposite the electronic circuit components preparatory metallization and a thermal wick. A heat pipe evaporator chamber and condenser assembly is attached to the multi-chip module and wick assembly. A suitable working fluid is introduced into the vapor chamber and the vapor chamber hermetically sealed. Application of the thermal wick to the heat producing multi-chip module eliminates the thermal impedance contributed by the thermal transmission media, permitting a doubling of heat flux from the multi-chip module to the heat pipe evaporator.

Some prior art devices may allow areas of the liquid coolant contained in the cooling device housing to stagnate thereby reducing the effectiveness of the heat transfer process. This is especially true for passive devices that cool integrated circuit chips (i.e. devices which do not utilize an electric pump or motor to circulate the coolant through the housing). Also, some prior art devices are relatively inefficient at transferring heat away from the integrated circuit device due to their overall configuration and design.

It would be desirable to provide an apparatus for cooling an integrated circuit device that is passive (i.e. no electric pump or motor) and which does not allow significant stagnation of the liquid coolant in the cooling device housing. It would also be desirable to provide an apparatus for cooling an integrated circuit device that efficiently transfers heat away from the integrated circuit device. It would further be desirable if such cooling apparatus was easy to assemble and inexpensive to manufacture.

SUMMARY OF THE INVENTION

In accordance with one embodiment of the present invention, there is provided an apparatus for cooling an integrated circuit device. The apparatus includes a container defining a chamber that is partially filled with a coolant which forms a coolant pool in the chamber, wherein heat generated by the integrated circuit device causes boiling of the coolant in the coolant pool so that vaporized coolant rises upwardly from the coolant pool and condenses on a ceiling of the chamber forming coolant droplets thereon. The apparatus further includes a cooling conduit positioned within the chamber and at least partially out of the coolant pool, the cooling conduit further being positioned in either (1) a first path traveled by the vaporized coolant as it rises upwardly from the coolant pool towards the ceiling, or (2) a second path traveled by the coolant droplets falling from the ceiling due to gravity.

Pursuant to another embodiment of the present invention, there is provided a method of cooling an integrated circuit device. The method includes the steps of (1) providing a container which defines a chamber; (2) partially filling the container with a coolant so as to form a coolant pool in the chamber; (3) generating heat by the integrated circuit device so as to boil the coolant in the coolant pool so that vaporized coolant rises upwardly from the coolant pool and condenses on a ceiling of the chamber forming coolant droplets thereon; and (4) positioning a cooling conduit (a) within the chamber, (b) at least partially out of the coolant pool, and (c) in a path traveled by either (i) the vaporized coolant as it rises upwardly from the coolant pool towards the ceiling, or (ii) the coolant droplets falling from the ceiling due to gravity.

It is therefore an object of the present invention to provide a new and useful apparatus for cooling an integrated circuit device.

It is a further object of the present invention to provide an improved apparatus for cooling an integrated circuit device.

It is another object of the present invention to provide a new and useful method of cooling an integrated circuit device.

It is moreover an object of the present invention to provide an improved method of cooling an integrated circuit device.

It is still another object of the present invention to provide an apparatus for cooling an integrated circuit device which is relatively efficient at transferring heat away from the integrated circuit device.

It is moreover another object of the present invention to provide a method for cooling an integrated circuit device which is relatively efficient at transferring heat away from the integrated circuit device.

It is yet another object of the present invention to provide an apparatus for cooling an integrated circuit device that is passive (i.e. no electric motor or pump) and which reduces stagnation of the liquid coolant contained in the cooling device housing.

It is still another object of the present invention to provide a method of cooling an integrated circuit device which reduces stagnation of the liquid coolant contained in the cooling device housing without the use of electric pumps or motors.

The above and other objects, features, and advantages of the present invention will become apparent from the following description and the attached drawings.

DETAILED DESCRIPTION OF THE PREFERRED EMBODIMENT

While the invention is susceptible to various modifications and alternative forms, specific embodiments thereof have been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 1:
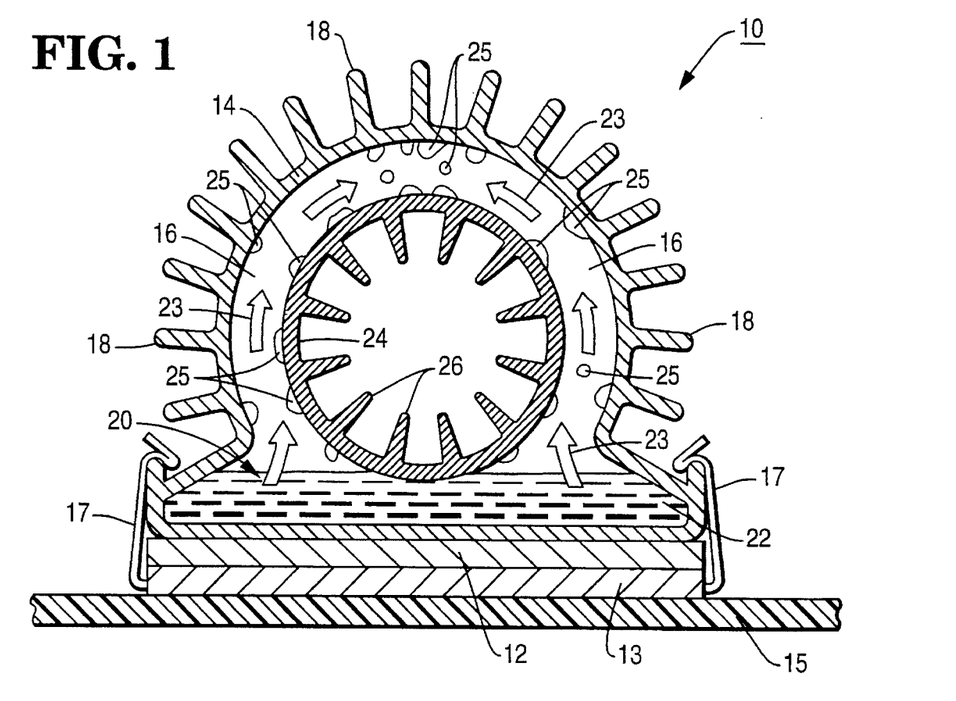
FIG. 1 is a sectional view taken in the direction of the arrows 1—1 of FIG. 3 showing a first embodiment of an apparatus for cooling an integrated circuit device that incorporates the features of the present invention therein.
Figure 2:
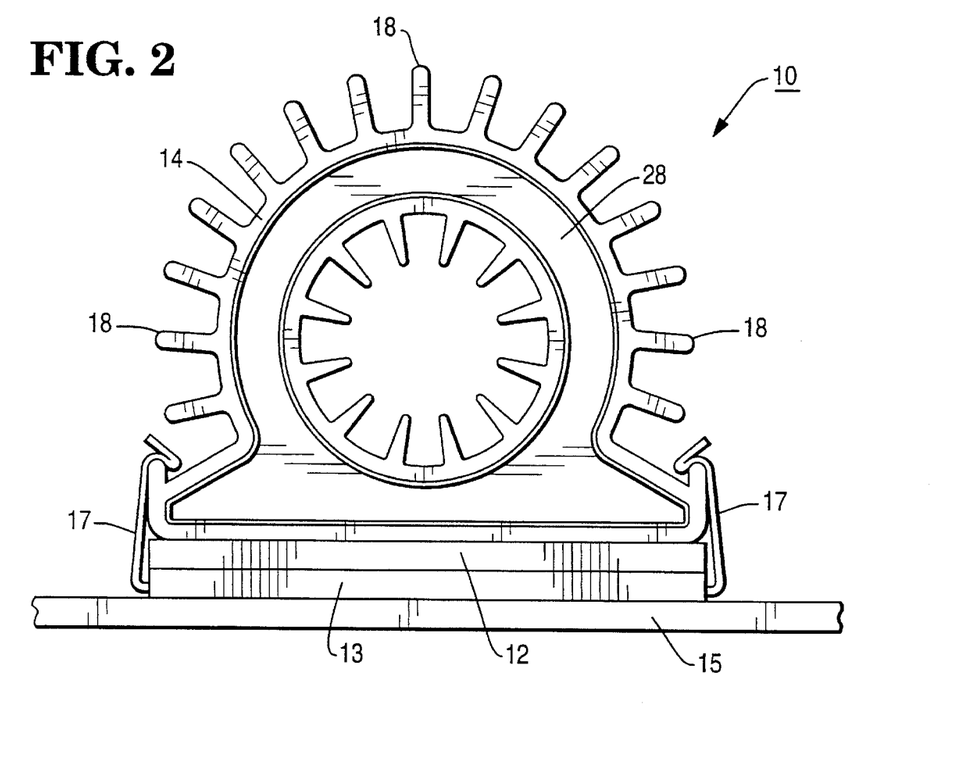
FIG. 2 is a side elevational view of the apparatus for cooling an integrated circuit device of FIG. 1 as taken along line 2—2 of FIG. 3.
Figure 3:
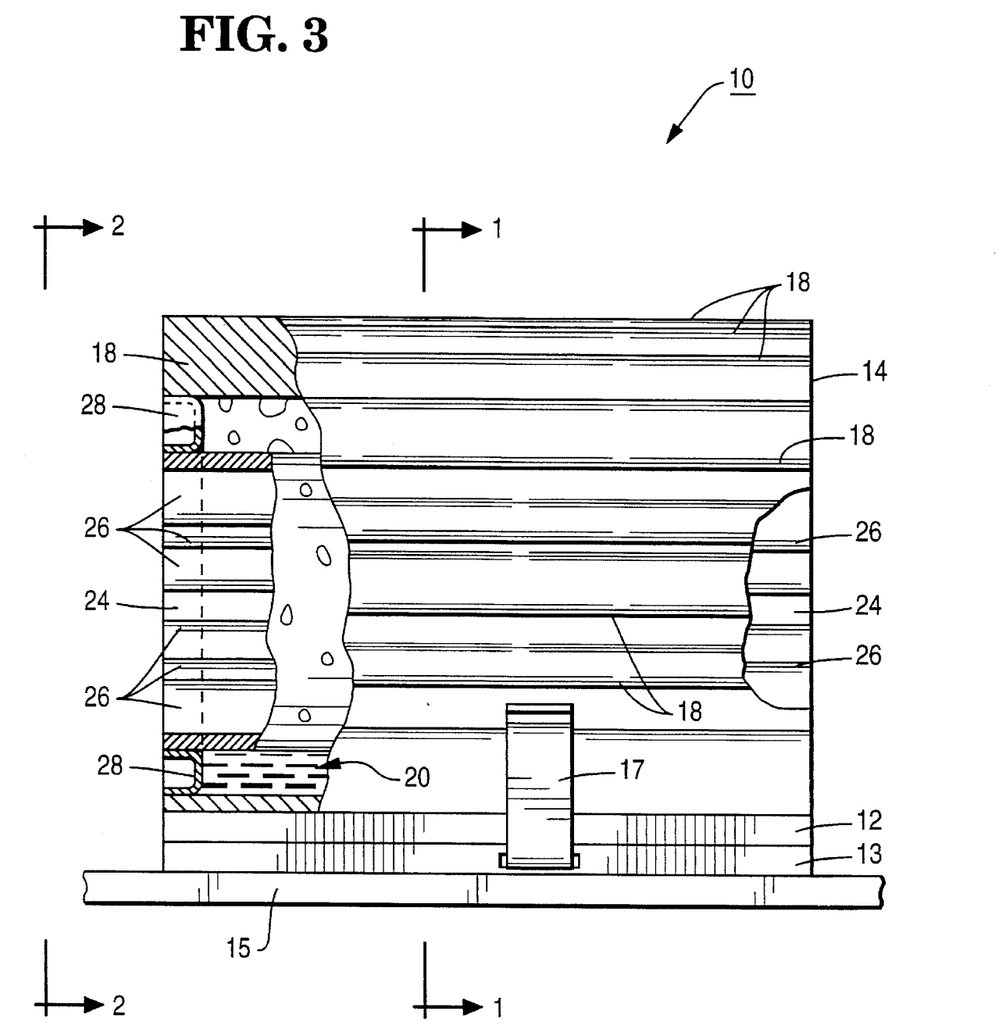
FIG. 3 is a front elevational view of the apparatus for cooling an integrated circuit device of FIG. 1, with a portion of the container of the apparatus shown removed for clarity of description.

Referring now to FIGS. 1–3, there is shown an apparatus 10 for cooling an integrated circuit device 12 such as a Pentium integrated circuit device available from Intel Corporation of Santa Clara, Calif. The cooling apparatus 10 represents a first embodiment of the present invention.

A chip socket 13 is secured to a printed circuit board 15 as shown in FIGS. 1–3. The printed circuit board 15 has positioned thereon numerous electrical circuits (not shown).

The integrated circuit device 12 is plugged into the chip socket 13 so as to connect the integrated circuit device to the electrical circuits on the printed circuit board. The chip socket 13 includes a pair of clips 17 which secure the cooling apparatus 10 at a location adjacent to the integrated circuit device 12.

The cooling apparatus 10 is positioned in contact with the integrated circuit device 12 as shown in FIGS. 1–3. Since the bottom of the cooling device 10 and the top of the integrated circuit device 12 may each be microscopically uneven so that these two surfaces are not positioned entirely flush against each other, a conductive paste is interposed between these two surfaces to enhance heat transfer. A conductive paste which may be used is a metal oxide filled, silicone-free synthetic grease. For example, one metal oxide filled, silicone-free synthetic grease which may be used is Sil-Free 1020, a trademark of Aavid Engineering, Inc. of Laconia, N.H.

The cooling apparatus 10 includes a container 14 defining a chamber 16. The container 14 is extruded from an aluminum material. The container 14 has a plurality of fins 18 extending therefrom.

The chamber 16 is partially filled with a coolant 20 which forms a coolant pool 22 in the chamber as shown in FIG. 1. The coolant 20 is a non-electrically conductive liquid. For example, the coolant 20 may be a non-electrically conductive fluorinated liquid such as Fluourinert, a trademark of Minnesota Mining and Manufacturing Company of St. Paul, Minn. If the cooling apparatus 10 were to crack thereby leaking the coolant 20 onto the printed circuit board, the circuits on the printed circuit board would not be short circuited since the coolant 20 is non-electrically conductive.

During its operation, the integrated circuit device 12 produces heat which causes boiling of the coolant 20 in the coolant pool 22. As a result, vaporized coolant, schematically shown as arrows 23 in FIG. 1, rises upwardly from the coolant pool towards a ceiling of the chamber 16. Upon reaching the ceiling of the chamber, the vaporized coolant 23 condenses thus forming coolant droplets 25 thereon. Thereafter, the coolant droplets 25 fall downwardly from the ceiling due to gravity.

The cooling apparatus 10 further includes a cooling conduit 24 positioned within the chamber 16. The cooling conduit 24 is positioned partially out of the coolant pool 22. Moreover, the cooling conduit is positioned in a first path traveled by the vaporized coolant 23 as it rises upwardly from the coolant pool towards the ceiling. As a result, coolant droplets form on the cooling conduit 24 as the vaporized coolant travels upwardly in the chamber 16. In addition, the cooling conduit 24 is positioned in a second path traveled by the coolant droplets 25 as they fall downwardly from the ceiling due to gravity.

The cooling conduit 24 is extruded into a substantially cylindrical member having an orifice on each side of thereof. The cooling conduit is extruded from an aluminum material. The cooling conduit 24 has a plurality of fins 26 extending inwardly as shown in FIGS. 1 and 2. As configured, the cooling conduit 24 defines a passageway though which ambient air (from outside the chamber 16) may pass.

The cooling apparatus 10 further includes a first end cap 28 (see FIGS. 2 and 3) and a second end cap (not shown) which is friction fit between the container 14 and the cooling conduit 24. A glue is applied between each end cap and the container 14, and each end cap and the cooling conduit 24 so as to provide a liquid tight seal. The first and second end caps support the cooling conduit 24 within the cooling apparatus 10. The first and second end caps are stamped into shape from an aluminum material. Each of the end caps has an opening defined therein. When the end caps are secured to the cooling conduit 24, each end cap opening aligns with a respective cooling conduit orifice. What is meant herein by the term "align" is that an opening of an end cap and an orifice of the cooling conduit overlap (i.e. align) to some extent so as to allow a fluid, such as air, to advance through the opening and the orifice when the end cap is secured to the cooling conduit. (See e.g. FIG. 3 which partially shows the alignment of the opening of end cap 28 with an orifice of cooling conduit 24.)

During operation of the integrated circuit device 12, heat is produced so that the coolant 20 in the coolant pool 22 boils. This causes vaporized coolant 23 to rise upwardly from the coolant pool and contact the cooling conduit 24. Some of the vaporized coolant 23 condenses on the cooling conduit thereby forming coolant droplets thereon. The rest of the vaporized coolant 23 continues to rise until it reaches the ceiling of the chamber 16 thereby forming coolant droplets 25 thereon. As the coolant droplets 25 continue to form on the ceiling, they begin to fall downwardly onto the cooling conduit 24 due to gravity. The coolant droplets then run downwardly over the surface of the cooling conduit 24 until they eventually return to the coolant pool 22.

As heat is generated by the integrated circuit device 12, it is transferred to the base of the container 14 and then to the coolant 20 in the coolant pool 22. As the coolant 20 boils, the vaporized coolant 23 rises upwardly in the container so as to contact the cooling conduit 24. Some of the heat is then transferred to the cooling conduit and then to the ambient air which is located within the passageway of the cooling conduit 24. As ambient air advances through the cooling conduit, the heat moves out of the passageway and is thereafter dissipated into the ambient surroundings.

As the remainder of the coolant vapor 23 continues to rise, it eventually contacts the ceiling of the chamber 16. Some of the heat is then transferred through the wall of the container 14 to the outside of the cooling apparatus 10 so as to be dissipated into the ambient surroundings.

As the coolant droplets 25 form on the ceiling of the chamber 16, they begin to drop downwardly due to gravity thereby contacting the cooling conduit 24. The coolant droplets then run downwardly over the surface of the cooling conduit 24. Some of the heat contained in these coolant droplets is transferred to the cooling conduit and then to the ambient surroundings as described above. Thereafter, the coolant droplets return to the coolant pool 22. The above-described cycle is then repeated so as to further cool the integrated circuit device 12.

Figure 4:
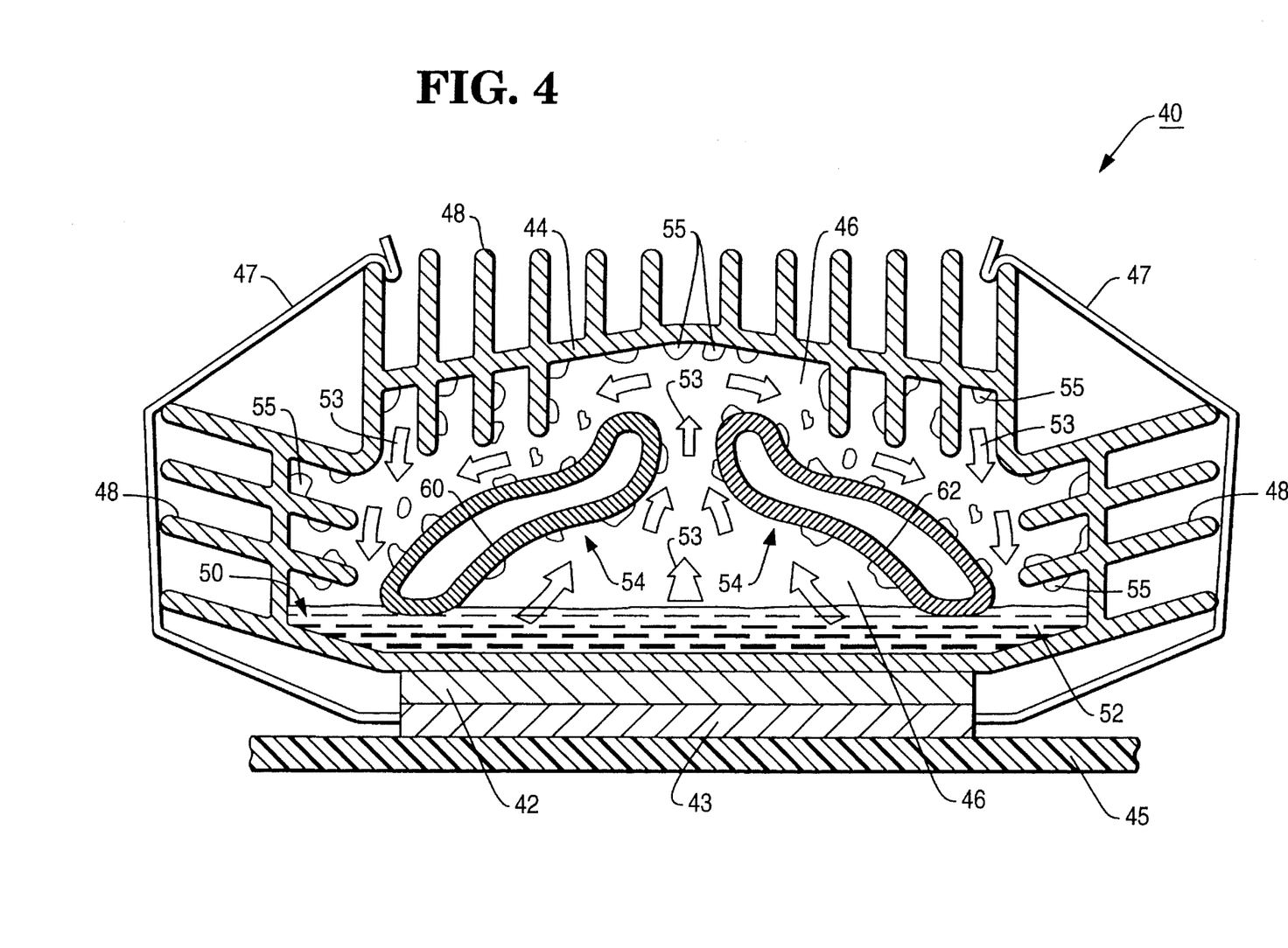
FIG. 4 is a sectional view taken in the direction of the arrows 4—4 of FIG. 6 showing a second embodiment of an apparatus for cooling an integrated circuit device that incorporates the features of the present invention therein.
Figure 5:
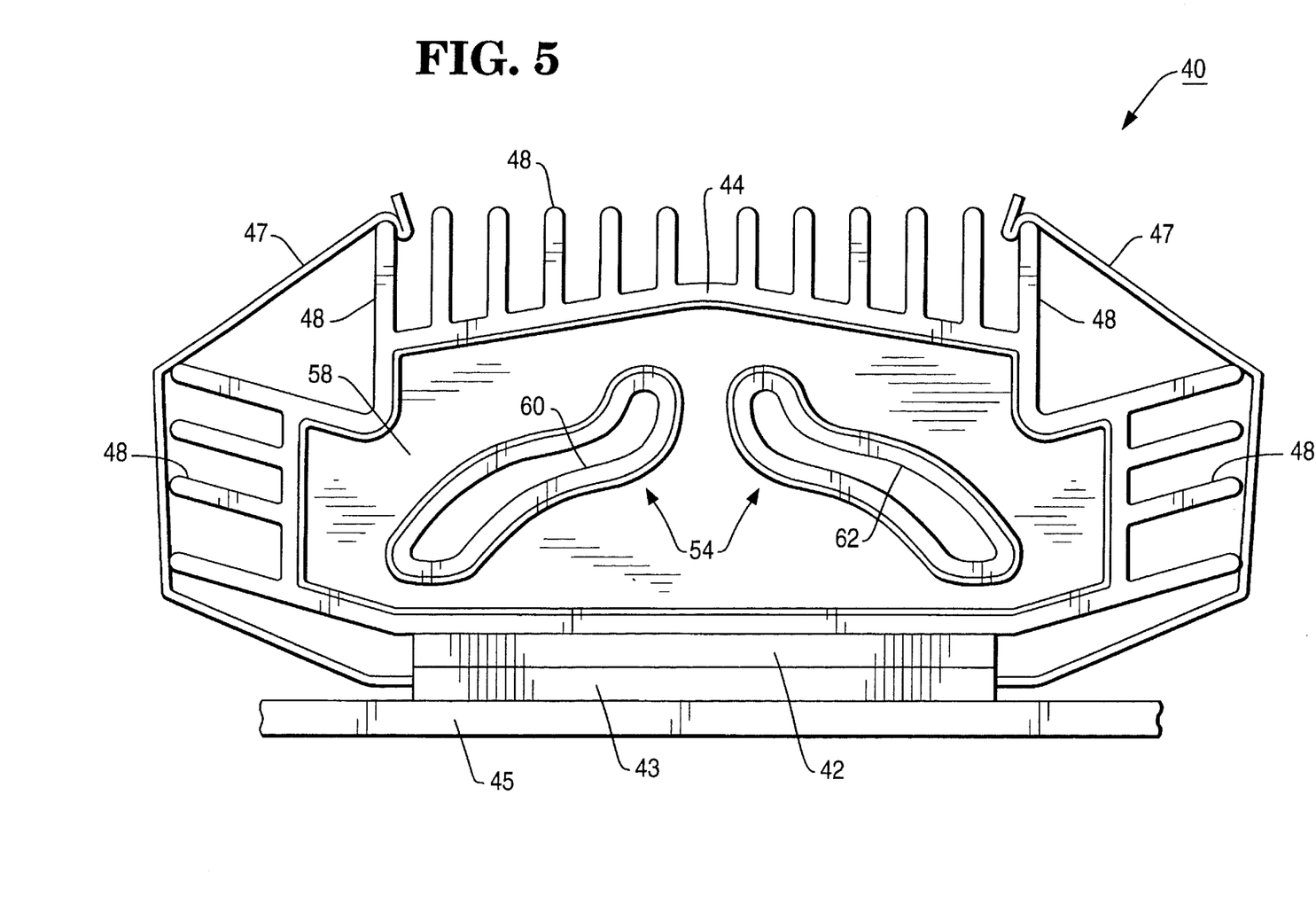
FIG. 5 is a side elevational view of the apparatus for cooling an integrated circuit device of FIG. 4 as taken along line 4—4 of FIG. 6.
Figure 6:
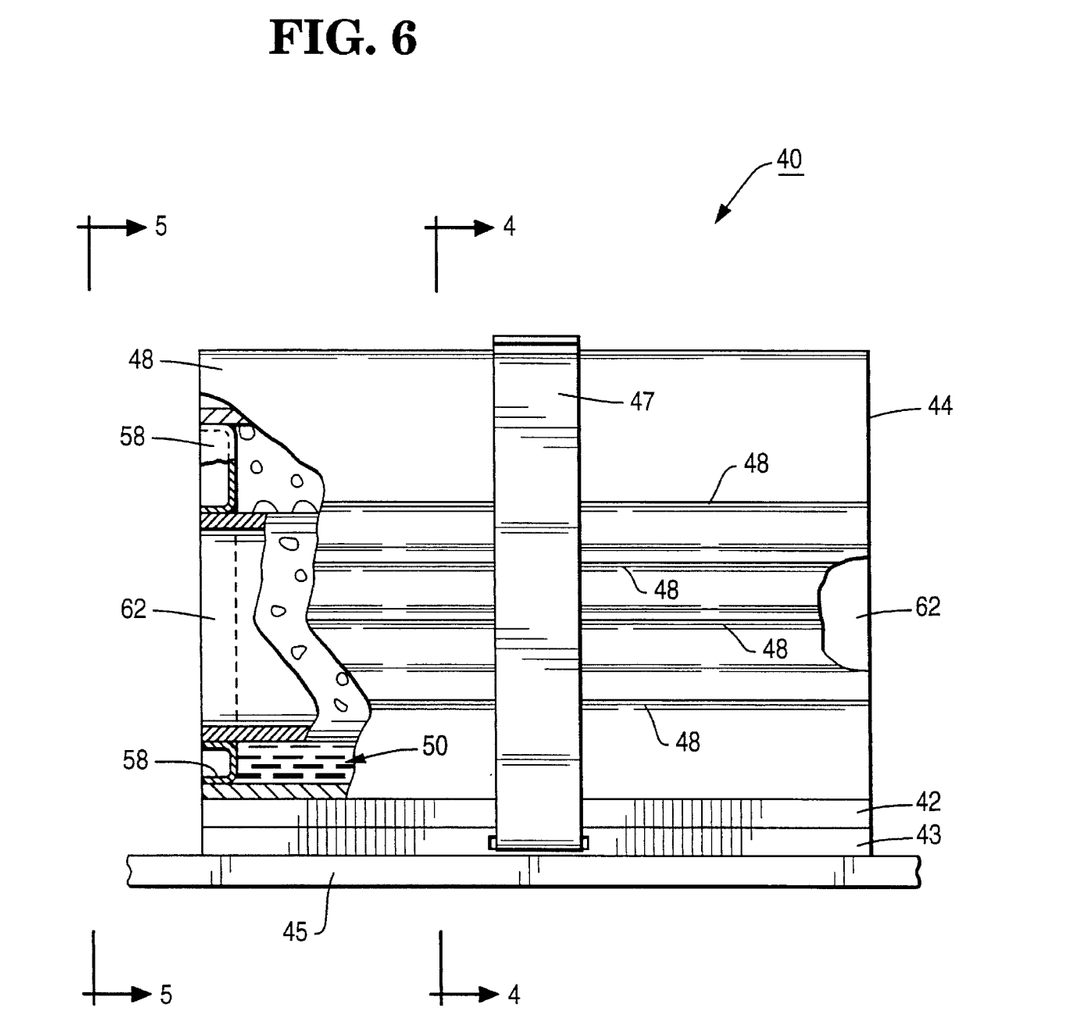
FIG. 6 is a front elevational view of the apparatus for cooling an integrated circuit device of FIG. 4, with a portion of the container of the apparatus shown removed for clarity of description.

Referring now to FIGS. 4–6, there is shown an apparatus 40 for cooling an integrated circuit 42 such as a Pentium integrated circuit device available from Intel Corporation. The cooling apparatus 40 represents a second embodiment of the present invention.

A chip socket 43 is secured to a printed circuit board 45 as shown in FIGS. 4–6. The printed circuit board 45 has positioned thereon numerous electrical circuits (not shown). The integrated circuit device 42 is plugged into the chip socket 43 so as to connect the integrated circuit device to the electrical circuits on the printed circuit board. The chip socket 43 includes a pair of clips 47 which secure the cooling apparatus 40 at a location adjacent to the integrated circuit device 42.

The cooling apparatus 40 is positioned in contact with the integrated circuit device 42 as shown in FIGS. 4–6. Since the bottom of the cooling device 40 and the top of the integrated circuit device 42 may each be microscopically uneven so that these two surfaces are not positioned entirely flush against each other, a conductive paste is interposed between these two surfaces to enhance heat transfer. A conductive paste which may be used is a metal oxide filled, silicone-free synthetic grease. For example, one metal oxide filled, silicone-free synthetic grease which may be used is Sil-Free 1020, a trademark Aavid Engineering, Inc. of Laconia, N.H.

The cooling apparatus 40 includes a container 44 defining a chamber 46. The container 44 is extruded from an aluminum material. The container 44 has a plurality of fins 48 extending therefrom.

The chamber 46 is partially filled with a coolant 50 which forms a coolant pool 52 in the chamber as shown in FIG. 4. The coolant 50 is a non-electrically conductive liquid. For example, the coolant 50 may be a non-electrically conductive fluorinated liquid such as Fluourinert, a trademark of Minnesota Mining and Manufacturing Company of St. Paul, Minn. If the cooling apparatus 40 were to crack thereby leaking the coolant 50 onto the printed circuit board, the circuits on the printed circuit board would not be short circuited since the coolant 50 is non-electrically conductive.

During its operation, the integrated circuit device 42 produces heat which causes boiling of the coolant 50 in the coolant pool 52. As a result, vaporized coolant, schematically shown as arrows 53 in FIG. 4, rises upwardly from the coolant pool towards a ceiling of the chamber 46. Upon reaching the ceiling of the chamber, the vaporized coolant 53 condenses thus forming coolant droplets 55 thereon. Thereafter, the coolant droplets 55 fall downwardly from the ceiling due to gravity.

The cooling apparatus 40 further includes a cooling conduit 54 positioned within the chamber 4. The cooling conduit 54 includes a first conduit segment 60 and a second conduit segment 62. The conduit segments 60 and 62 are positioned partially out of the coolant pool 52 as shown in FIG. 4. Moreover, the conduit segments 60 and 62 are positioned in a first path traveled by the vaporized coolant 53 as it rises upwardly from the coolant pool towards the ceiling. As a result, coolant droplets form on the conduit segments 60 and 62 as the vaporized coolant travels upwardly in the chamber 46. In addition, the conduit segments 60 and 62 are positioned in a second path traveled by the coolant droplets 55 as they fall downwardly from the ceiling due to gravity.

Each of the conduit segments 60 and 62 is extruded into an elongated member having a central channel extending therethrough. Each of the conduit segments has an orifice on each side of thereof. The conduit segments 60 and 62 are extruded from an aluminum material. As configured, each of the conduit segments 60 and 62 defines a passageway though which ambient air (from outside the chamber 46) may pass.

The cooling apparatus 40 further includes a first end cap 58 (see FIGS. 5 and 6) and a second end cap (not shown) which is friction fit between the container 44 and the cooling segments 60 and 62. A glue is applied between each end cap and the container 44, and each end cap and the conduit segments 60 and 62 so as to provide a liquid tight seal. The first and second end caps support the conduit segments 60 and 62 within the cooling apparatus 40. The first and second end caps are stamped into shape from an aluminum material. Each of the end caps has two openings defined therein. When the end caps are secured to the conduit segments 60 and 62, the two openings of each end cap aligns with two respective orifices of the two conduit segments. What is meant herein by the term "align" is that an opening of an end cap and an orifice of a conduit segment overlaps (i.e. aligns) to some extent so as to allow a fluid, such as air, to advance through the opening and the orifice when the end cap is secured to the conduit segment. (See e.g. FIG. 6 which partially shows the alignment of one opening of end cap 58 with an orifice of the conduit segment 62.)

During operation of the integrated circuit device 42, heat is produced so that the coolant 50 in the coolant pool 52 boils. This causes vaporized coolant 53 to rise upwardly from the coolant pool and contact the conduit segments 60 and 62. Some of the vaporized coolant 53 condenses on the conduit segments 60 and 62 thereby forming coolant droplets thereon. The rest of the vaporized coolant 53 continues to rise until it reaches the ceiling of the chamber 46 thereby forming coolant droplets 55 thereon. As the coolant droplets 55 continue to form on the ceiling, they begin to fall downwardly onto the conduit segments 60 and 62 due to gravity. The coolant droplets then run downwardly over the surface of the conduit segments 60 and 62 until they eventually return to the coolant pool 52.

As heat is generated by the integrated circuit device 42, it is transferred to the base of the container 44 and then to the coolant 50 in the coolant pool 52. As the coolant 50 boils, the vaporized coolant 53 rises upwardly in the container so as to contact the conduit segments 60 and 62. Some of the heat is then transferred to the conduit segments and then to the ambient air which is located within the passageways of the conduit segments 60 and 62. As ambient air advances through the conduit segments, the heat moves out of the passageways and is thereafter dissipated into the ambient surroundings.

As the remainder of the coolant vapor 53 continues to rise, it eventually contacts the ceiling of the chamber 46. Some of the heat is then transferred through the wall of the container 44 to the outside of the cooling apparatus 40 so as to be dissipated into the ambient surroundings.

As the coolant droplets 55 form on the ceiling of the chamber 46, they begin to drop downwardly due to gravity thereby contacting the conduit segments 60 and 62. The coolant droplets then run downwardly over the surface of the conduit segments 60 and 62. Some of the heat contained in these coolant droplets is transferred to the conduit segments and then to the ambient surroundings as described above. Thereafter, the coolant droplets return to the coolant pool 52. The above-described cycle is then repeated so as to further cool the integrated circuit device 42.

While the invention has been illustrated and described in detail in the drawings and foregoing description, such illustration and description is to be considered as exemplary and not restrictive in character, it being understood that only the preferred embodiments have been shown and described and that all changes and modifications that come within the spirit of the invention are desired to be protected.

What is claimed is:

1. An apparatus for cooling an integrated circuit device, comprising:

a container having a base positionable vertically above and in contact with said integrated circuit device, and defining a chamber that is partially filled with a coolant which forms a coolant pool in the chamber above said container base, wherein heat generated by the integrated circuit device is transferred to said container base and then to said coolant to cause boiling of the coolant in the coolant pool so that vaporized coolant rises upwardly from the coolant pool and condenses on a ceiling of the chamber forming coolant droplets thereon; and a cooling conduit positioned within the chamber and in part out of the coolant pool and in part in the coolant pool, said cooling conduit further being positioned in either (1) a first path traveled by the vaporized coolant as it rises upwardly from the coolant pool towards the ceiling, or (2) a second path traveled by the coolant droplets falling from the ceiling due to gravity.

2. The apparatus of claim 1, wherein said cooling conduit is positioned in both (1) the first path traveled by the vaporized coolant as it rises upwardly from the coolant pool towards the ceiling, and (2) the second path traveled by the coolant droplets falling from the ceiling due to gravity.

3. The apparatus of claim 1, wherein:

said container has a first opening and a second opening defined therein; and said cooling conduit is secured to said container and has a first orifice and a second orifice, wherein the first opening is aligned with the first orifice and the second opening is aligned with the second orifice, wherein ambient air located outside of the chamber is able to pass through the cooling conduit.

4. The apparatus of claim 1, wherein the coolant is a non-electrically conductive liquid.

5. The apparatus of claim 1, wherein said cooling conduit includes:

a first conduit segment attached to said container; and a second conduit segment attached to said container.

6. The apparatus of claim 5, wherein:

said container has defined therein a first opening, a second opening, a third opening, and a fourth opening;

said first conduit segment is secured to said container and has a first orifice and a second orifice, wherein the first opening is aligned with the first orifice and the second opening is aligned with the second orifice;

said second conduit segment is secured to said container and has a third orifice and a fourth orifice, wherein the third opening is aligned with the third orifice and the fourth opening is aligned with the fourth orifice, wherein ambient air located outside of the chamber is able to pass through the first conduit segment and the second conduit segment.

7. A method of cooling an integrated circuit device, comprising the steps of:

providing a container having a base positionable vertically above and in contact with said integrated circuit device, and which defines a chamber;

partially filling the container with a coolant so as to form a coolant pool in the chamber above said container base;

generating heat by the integrated circuit device so as to transfer said heat to said container base and then to said coolant to boil the coolant in the coolant pool so that vaporized coolant rises upwardly from the coolant pool and condenses on a ceiling of the chamber forming coolant droplets thereon; and positioning a cooling conduit (1) within the chamber, (2) in part out of the coolant pool and in part in the coolant pool, and (3) in a path traveled by either (a) the vaporized coolant as it rises upwardly from the coolant pool towards the ceiling, or (b) the coolant droplets falling from the ceiling due to gravity.

8. The method of claim 7, further comprising the step of allowing ambient air from outside of the chamber to be advanced though the cooling conduit.

9. The method of claim 7, wherein the positioning step includes the step of positioning the cooling conduit in both (1) the first path traveled by the vaporized coolant as it rises upwardly from the coolant pool towards the ceiling, and (2) the second path traveled by the coolant droplets falling from the ceiling due to gravity.

10. An apparatus for cooling an electronic device, comprising:

a container having a base positionable vertically above and in contact with said electronic device, and defining a chamber that is partially filled with a coolant which forms a coolant pool in the chamber above said container base, wherein heat generated by the electronic device is transferred to said container base and then to said coolant to cause vaporization of the coolant in the coolant pool so that vaporized coolant rises upwardly from the coolant pool and condenses on a ceiling of the chamber forming coolant droplets thereon; and a cooling conduit secured to said container, said cooling conduit being positioned within the chamber and in part out of the coolant pool and in part in the coolant pool, said cooling conduit further being positioned in both a first path traveled by the vaporized coolant as it rises upwardly from the coolant pool towards the ceiling, and a second path traveled by the coolant droplets falling from the ceiling due to gravity.

11. An apparatus according to claim 10 further comprising means for removably attaching said container to said electronic device.

12. An apparatus according to claim 11 wherein said attaching means comprise a pair of clips.

13. An apparatus according to claim 10 wherein said cooling conduit and said chamber are relatively sized and configured so that said cooling conduit has a horizontal extent blocking most of said chamber above said coolant pool to divert said driving rising coolant around said cooling conduit to said ceiling to effect said first path and to condense said vaporized coolant on said cooling conduit, and to divert said falling coolant droplets around said cooling conduit back to said pool to effect said second path.

14. An apparatus according to claim 13 wherein said cooling conduit extends through said chamber and has orifices at opposite ends thereof for passing ambient air from outside said chamber to cool said cooling conduit.

15. An apparatus according to claim 14 wherein said cooling conduit is cylindrical, and said chamber above said coolant pool is in part cylindrical and disposed concentrically with said cooling conduit.

16. An apparatus according to claim 15 wherein said container has a plurality of external fins extending radially from said cylindrical portion thereof, and said cooling conduit has a plurality of internal fins extending radially inwardly for being cooled by said ambient air.

17. An apparatus according to claim 15 wherein said container has a necked-in portion between said cylindrical portion and said portion defining said pool.

18. An apparatus according to claim 14 wherein said cooling conduit is configured and positioned in said container to define substantially different ones of said first and second paths.

19. An apparatus according to claim 18 wherein said cooling conduit is inclined so that said vaporized coolant travels upwardly along a lower surface thereof in said first path, and said coolant droplets fall on an upper surface thereof for travel back to said coolant pool in said second path.

20. An apparatus according to claim 19 further comprising a pair of said cooling conduits converging toward each other from said coolant pool and spaced apart at vertically top ends to define said first path upwardly therebetween toward said top ends thereof, and to define said second path downwardly and horizontally away from said top ends thereof.

* * * * *